United States Patent [19]

Leuschner

[11] 4,404,579

[45] Sep. 13, 1983

[54] SEMICONDUCTOR DEVICE HAVING REDUCED CAPACITANCE AND METHOD OF FABRICATION THEREOF

[75] Inventor: Horst Leuschner, Austin, Tex.

[73] Assignee: Inc. Motorola, Schaumburg, Ill.

[21] Appl. No.: 201,102

[22] Filed: Oct. 28, 1980

[51] Int. Cl.[3] .................... H01L 29/78; H01L 29/04; H01L 29/34
[52] U.S. Cl. ........................................ 357/23; 357/41; 357/52; 357/59
[58] Field of Search .................. 357/23 CS, 23 S, 59, 357/52, 41

[56] References Cited

U.S. PATENT DOCUMENTS

| | | | |
|---|---|---|---|
| 3,755,001 | 8/1973 | Kooi | 357/23 CS |
| 4,287,661 | 9/1981 | Stoffel | 357/23 S |
| 4,370,669 | 1/1983 | Donley | 357/51 |

FOREIGN PATENT DOCUMENTS

| | | | |
|---|---|---|---|
| 52-65686 | 5/1977 | Japan | 357/23 CS |
| 54-8475 | 1/1979 | Japan | 357/23 CS |
| 54-8985 | 1/1979 | Japan | 357/23 CS |
| 54-16186 | 2/1979 | Japan | 357/23 CS |
| 2002583 | 2/1979 | United Kingdom | 357/23 CS |

OTHER PUBLICATIONS

Tasch, Jr., et al, IEEE Trans. on Electron Devices, vol. ED 23, No. 2, Feb. 1976, pp. 126-131.

Primary Examiner—William D. Larkins
Attorney, Agent, or Firm—Anthony J. Sarli, Jr.; Jeffrey Van Myers; James L. Clingan, Jr.

[57] ABSTRACT

A spacer region is provided between the channel stop region and the adjacent portion of the active region of a semiconductor device to reduce the capacitance therebetween. The spacer region may be formed by allowing at least a portion of a conductive line formed on the surface of the device to overlap the active region adjacent the channel stop region.

4 Claims, 10 Drawing Figures

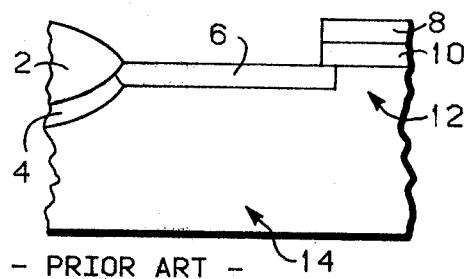
FIG 1 — PRIOR ART —
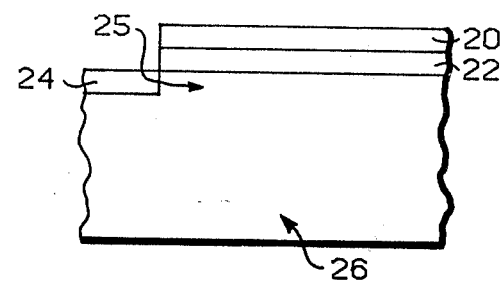
FIG 2
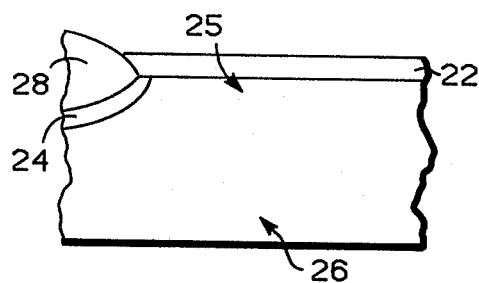
FIG 3
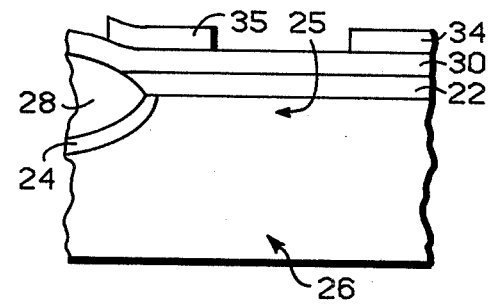
FIG 4
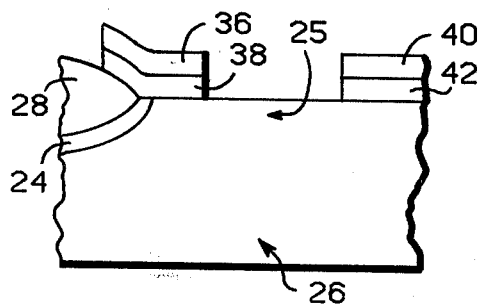
FIG 5
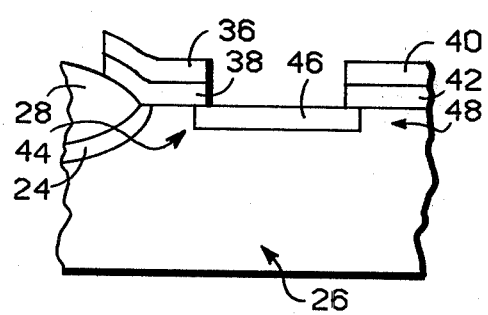
FIG 6

SEMICONDUCTOR DEVICE HAVING REDUCED CAPACITANCE AND METHOD OF FABRICATION THEREOF

TECHNICAL FIELD

This invention relates to semiconductor devices and more particularly to a method for manufacturing semiconductor devices having high speed and density.

BACKGROUND ART

In the manufacture of integrated circuits the continuing attempt is to increase transistor density on a substrate of semiconductor material. In this pursuit of higher density, leakage current between transistors has been a problem. One solution to this problem has been the use of channel stop regions which surround each transistor for the purpose of preventing leakage current between transistors. For example, insulated gate field effect transistors can be separated from each other by channel stop regions of the same conductivity type as that of the substrate but of a higher concentration of dopant than that of the substrate. This reduces the leakage current because in the existing art, the channel stop region adjoins the drain or source of the IGFET formed in the active region. The existence of a higher concentration of dopant in the channel stop region, however, creates a reverse biased P-N junction which is stronger than that which would normally exist. Because the channel stop region has a higher concentration of dopant than that of the substrate, the capacitance between the channel stop region and the drain or source is also greater than that of the capacitance between drain or source and the substrate. This increased capacitance has the adverse effect of slowing down the switching speed of the transistor.

In one type of insulated silicon gate field effect transistor technology, polysilicon lines across the surface are used also as electrical conductors between transistors. These polysilicon lines are an additional source of capacitance. To minimize this capacitance, design practice requires that polysilicon lines be laterally offset from adjacent transistors. This has the detrimental effect of decreasing transistor density.

BRIEF SUMMARY OF INVENTION

In the case where a polysilicon line is electrically connected to the source or drain of a particular device, no capacitance exists between that polysilicon line and the associated source or drain. Consequently, the reason for the spacing is eliminated. Advantage may be taken of the zero capacitance situation by using the polysilicon line to act as a masking layer under which a spacer region may be easily formed to separate the source or drain from the channel stop region. An object of this invention, therefore, is to reduce source or drain to channel stop region capacitance while not increasing process complexity or mask alignment problems.

The foregoing and other objects and advantages are accomplished in accordance with the instant invention by providing an insulated silicon gate field effect transistor having a spacer region between the channel stop region and the active region. The spacer region is of the same conductivity type as the channel stop region but has a lower doping concentration than that of the channel stop region. Consequently, in the case of an insulated silicon gate field effect transistor, the capacitance between the drain or source in the region of conductivity opposite to that of the drain or source is reduced. No additional processing steps are required because the spacer region is provided at the same process step which provides the channel region.

In a preferred method of fabricating the improved insulated silicon gate field effect transistor, an active region of a semiconductor body is masked off and the channel stop region is doped with the material which causes a conductivity type that is the same as that of the substrate. An oxide is then formed over the channel stop region. A new mask is provided comprising polysilicon as a top layer with an oxide layer between the polysilicon and the substrate. This mask is used to form the spacer region and a channel region. The unmasked region is doped with an impurity which causes a conductivity type opposite to that of the substrate. This provides a source and drain separated by the channel. This also provides for the spacer region between the source or drain and the channel stop region. The oxide and polysilicon over the spacer regions can either be left electrically floating or can be used as a conductor whichever is appropriate for the particular circuit.

BRIEF DESCRIPTION OF DRAWINGS

FIG. 1 is a cross section of a portion of a semiconductor device depicting the prior art.

FIG. 2 is a cross section of a substrate of semiconductor material after initial processing steps to define an active area and a channel stop region.

FIG. 3 is a cross section of the substrate shown in FIG. 2 after application of a field oxide.

FIG. 4 is a cross section of the substrate shown in FIG. 3 after the processing steps to obtain a photoresist mask over a layer of polysilicon and a layer of oxide.

FIG. 5 is a cross section of the substrate shown in FIG. 4 after an etching of the polysilicon and oxide layers.

FIG. 6 is a cross section of the substrate shown in FIG. 5 after completing the method of the instant invention.

DETAILED DESCRIPTION OF INVENTION

Figure 7:
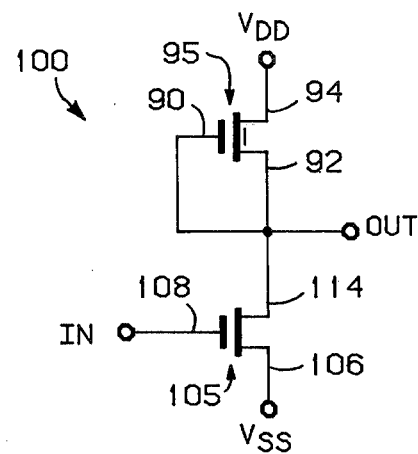
FIG. 7 is a circuit diagram of an inverter.

FIG. 1 shows a portion of an insulated gate field effect transistor (hereinafter referred to as IGFET) fabricated using a process of the prior art. An IGFET has a source and drain separated by a channel with a gate over the channel but insulated from it. The source and drain are formed in a substrate of semiconductor material doped to a first conductivity type with said source and drain doped to a second conductivity type. In an enchancement mode IGFET, the channel has the same conductivity type as the substrate. In a depletion mode IGFET the channel has the same conductivity type as the source and drain but with a lower concentration of dopant. FIG. 1 shows the portion of an enhancement mode IGFET that is relevant in describing the improvement of the instant invention. Although an enhancement mode IGFET has been chosen as an example, the invention also does apply to depletion mode IGFET's. Specifically, a source or drain region 6 is adjoined by a channel stop region 4 which has the same conductivity type as a substrate 14 but has a higher concentration of dopant. A gate 8 is separated from a channel 12 by an insulating region 10, normally of silicon oxide. A field oxide 2 is provided over the channel stop region. In the art a field oxide is used to define the periphery of an active region, an active region being a region where active elements such as diodes and transistors are formed. A substrate can have many active regions.

As will be subsequently described, the instant invention includes providing a spacer region between the source or drain in the active region and the channel stop region with said spacer region having the same conductivity type as the substrate and having substantially the same concentration of dopant.

Illustrated in FIGS. 2-6 are several of the steps of one preferred method for forming such a spacer region in accordance with the present invention. A semiconductor body, which has been prepared by any suitable prior art process, provides a substrate 26 (FIG. 2) of monocrystalline silicon, doped to exhibit P-type conductivity for carrying an N-channel IGFET structure fabricated according to the steps of this method. If, however, P-channel IGFET's are desired, the starting material could be doped to exhibit N-type conductivity. After masking and removing a portion of a lower layer of silicon oxide 22 and an upper layer of silicon nitride 20 to define an active region 25, a channel stop region 24 is doped so that it exhibits a stronger P-type conductivity than that of the substrate 26. Field oxide 28 (FIG. 3) is then grown over the channel stop region 24, and the layer of silicon nitride 20 removed. After a layer of polysilicon 30 (FIG. 4) is applied, photoresist mask portions 34 and 35 are used to allow selective etching of the polysilicon 30 and silicon oxide 22 layers. The location of the photoresist mask portion 35 is a departure from the prior art in that it extends over the active region rather than being formed wholly over the field oxide 28. Thus, after an etching (FIG. 5), at least a portion of a polysilicon line 36, with oxide line 38 underneath, overlaps the active region 25 and the field oxide 28.

The polysilicon line 36, a polysilicon gate 40, and the source or drain 46 are then doped with phosphorus or arsenic or some other dopant that causes N-type conductivity. This leaves a line of two layers comprising an upper electrically conductive polysilicon line 36 and a lower insulating oxide line 38. Because of the presence of layers 36 and 38 which act as a mask against the N-dopant, a spacer region 44 of the substrate is thereby retained between the source or drain 46 and the channel stop region 24.

One application of the instant invention, illustrated in FIGS. 7-10, is an inverter 100 (FIG. 7) using an N-channel enhancement mode IGFET 105 and an N-channel depletion mode IGFET 95. In this inverter 100, a gate 90 and a source 92 of IGFET 95 are electrically connected to a drain 114 of IGFET 105. This electrical connection forms the output of the inverter 100. The input is a gate 108 of IGFET 105. Source 106 of IGFET 105 is connected to a negative supply $V_{SS}$, such as ground, whereas the drain 94 of IGFET 95 is connected to a positive supply $V_{DD}$, such as 5 volts.

Figure 8:
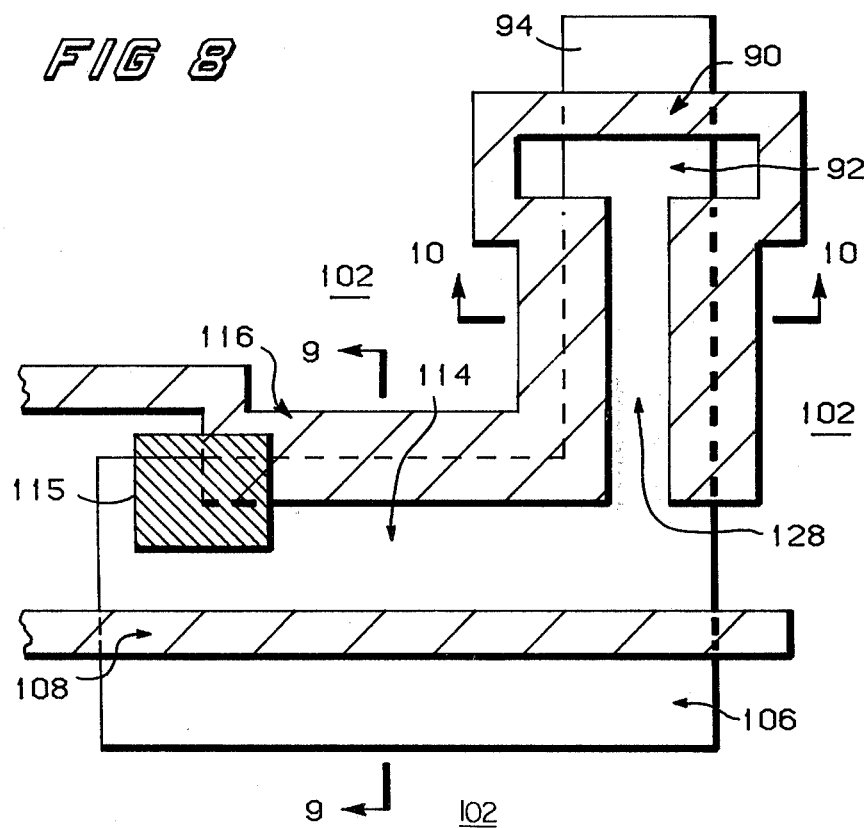
FIG. 8 is a top view of the inverter shown in FIG. 7 as fabricated on a substrate.

A top view of one layout of the inverter 100 is shown in FIG. 8. Field oxide 102 surrounds an active region that contains the two IGFET's. The drain 114 of IGFET 105 and the source 92 of IGFET 95 comprise spaced portions of a region 128 of N-type conductivity.

Figure 9:
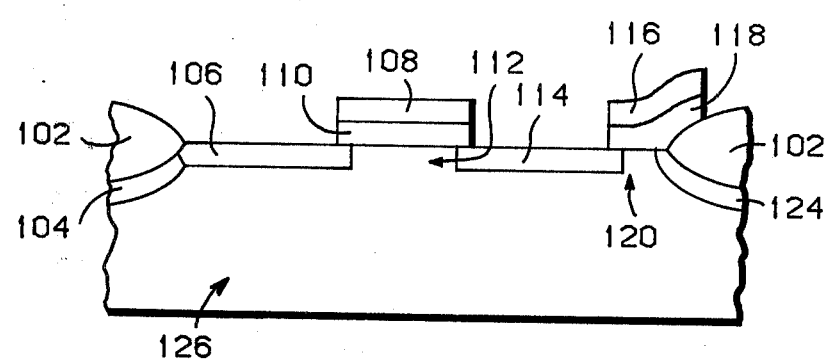
FIG. 9 is a cross section of the enhancement mode IGFET of the inverter shown in FIG. 8 depicting a spacer region.

A cross section of IGFET 105 taken along the line 9—9 of FIG. 8 is shown in FIG. 9. A spacer region 120 separates a channel stop region 124 from the drain region 114. The upper polysilicon line 116 and a lower oxide line 118 formed a mask for the creation of the spacer region 120 in the method described supra. A polysilicon line 116 interconnects the gate 90 of IGFET 95 to the drain 114 (FIG. 8) of IGFET 105 at a contact 115. The lower oxide line 118 insulates the upper polysilicon line 116 from the surface of the substrate 126. The gate 108 is separated from the surface of the substrate 126 by a gate oxide 110 over a channel region 112 between the source 106 and the drain 114. Field oxide region 102 defines the periphery of the active region. Channel stop regions 104 and 124 are underneath the field oxide.

Figure 10:
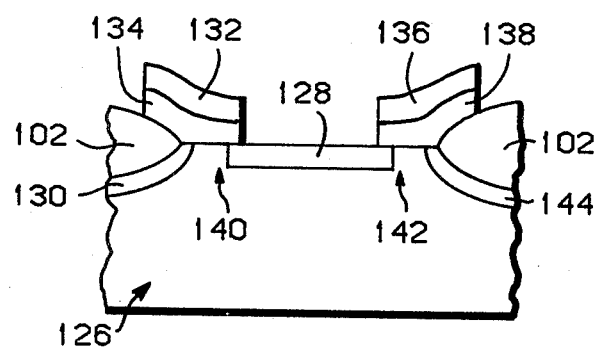
FIG. 10 is a cross section of a portion of the inverter shown in FIG. 8 depicting two spacer regions.

FIG. 10 shows a cross section taken along the line 10—10 of FIG. 8. Field oxide region 102 defines the periphery of the active region. The region 128 connects the drain 114 (FIG. 9) of the enhancement mode IGFET to the drain 92 (FIG. 8) of the depletion mode IGFET. Spacer regions 140 and 142 separate the region 128 from channel stop regions 130 and 144, respectively. A portion 132 of polysilicon line 116 connects the drain 114 of IGFET 105 to the gate 90 of IGFET 95. The portion 132 and the underlying oxide portion 134 form the mask for the spacer region 140. A portion 136 of polysilicon line 116 and the underlying oxide portion 138 are an extension of the gate 90 of IGFET 95 for the purpose of creating the spacer region 142.

This inverter circuit profits from the instant invention in two ways. Space is saved since the polysilicon line 116 overlaps the active region instead of being some distance from it. This violation of conventional design rules is acceptable in this case since the polysilicon line 116 is directly connected to the drain 114 of IGFET 105 and therefore causes no harmful capacitance effects. On the other hand, capacitance between the drain 114 of IGFET 105 and the source 92 of IGFET 95, and channel stop regions 124, 144, and 130 is reduced because of the existence of the spacer regions 120, 142, and 140, respectively.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. An inverter formed on a substrate of semiconductor material of a first conductivity type, said substrate having a field which defines the periphery of an active region and having a channel stop region of the first conductivity type but of a higher concentration of dopant than the substrate, said channel stop region being underneath the field, said inverter comprising:

a first transistor having a source region doped to a second conductivity type, a channel region of the first conductivity type, and a drain region doped to the second conductivity type, formed in the active region, said drain region coupled to a first power supply terminal;

a second transistor having a source region doped to the second conductivity type, a drain region doped to the second conductivity type, and a channel region of the first conductivity type formed in the active region, said source coupled to a second power supply terminal wherein the source region of the first transistor is formed in common with the drain region of the second transistor to form an output of the inverter;

a first line on the surface of the substrate a first portion of which overlaps a portion of the active region and the field, a second portion of which overlies the channel region of the first transistor to form a gate thereof, said line comprising a lower insulating layer, and an upper electrically conductive layer, said upper electrically conductive layer being physically continuous between said first and second portions and electrically connected to the drain region of the first transistor;

a spacer region of the first conductivity type and of substantially the same doping concentration as the substrate formed in the active region between the channel stop region and the source and drain regions of the first and second transistors, respectively, and underneath the first portion of the first line; and a second line on the surface of the substrate comprising a lower insulating layer and an upper electrically conductive layer and overlying the channel region of the second transistor to form an input of the inverter.

2. The inverter of claim 1 wherein the substrate is monocrystalline silicon and the field is silicon oxide.

3. The inverter of claim 2 wherein the second layer of the first line is polysilicon of the second conductivity type.

4. An inverter fabricated on a substrate of semiconductor material of a first conductivity type, said substrate having a field which defines the periphery of an active region and having a channel stop region of the first conductivity type but having a higher concentration of dopant than the substrate, said channel stop region being underneath the field, said inverter comprising:

a first transitor having a source region of a second conductivity type, a channel region, and a drain region of the second conductivity type formed in the active region, the source region having at least a portion which is spaced from the channel stop region;

a second transistor having a source region of the second conductivity type, a channel region, and a drain region of the second conductivity type which is formed in common with the source region of the first transistor, the drain region having at least a portion which is spaced from the channel stop region;

a first line on the surface of the substrate, a first portion of which overlaps a portion of the active region and the field, a second portion of which overlies the channel region of the first transistor to form a gate for the first transistor, the first line having a lower insulating layer and an upper electrically conductive layer, said upper electrically conductive layer being physically continuous between said first and second portions; and a second line on the surface of the substrate having a lower insulating layer and an upper electrically conductive layer and overlying the channel region of the second transistor to form a gate for the second transistor.

* * * * *